United States Patent
Wang et al.

(10) Patent No.: US 11,002,802 B2
(45) Date of Patent: May 11, 2021

(54) FAULT DETECTION METHOD FOR BUCK CONVERTER BASED ON INVERSE KALMAN FILTER

(71) Applicant: Jiangnan University, Wuxi (CN)

(72) Inventors: Ziyun Wang, Wuxi (CN); Yan Wang, Wuxi (CN); Zixing Liu, Wuxi (CN); Zhicheng Ji, Wuxi (CN); Guixiang Xu, Wuxi (CN); Shuai Zhang, Wuxi (CN)

(73) Assignee: Jiangnan University, Wuxi (CN)

( * ) Notice: Subject to any disclaimer, the term of this patent is extended or adjusted under 35 U.S.C. 154(b) by 8 days.

(21) Appl. No.: 16/744,266

(22) Filed: Jan. 16, 2020

(65) Prior Publication Data

US 2020/0150193 A1    May 14, 2020

Related U.S. Application Data

(63) Continuation of application No. PCT/CN2019/094386, filed on Jul. 2, 2019.

(30) Foreign Application Priority Data

Dec. 12, 2018  (CN) .......................... 201811515424.6

(51) Int. Cl.
    *G01R 31/72*    (2020.01)
    *H02M 3/158*    (2006.01)
    *H02M 1/32*    (2007.01)

(52) U.S. Cl.
    CPC ............ *G01R 31/72* (2020.01); *H02M 3/158* (2013.01); *H02M 1/32* (2013.01)

(58) Field of Classification Search
    CPC .............................. G01R 31/72; H02M 3/158
    (Continued)

(56) References Cited

U.S. PATENT DOCUMENTS 7,415,622 B2 * 8/2008 Masson ................. H02M 3/157
                                                    713/300

FOREIGN PATENT DOCUMENTS

| CN | 103577710 A | 2/2014 |
| CN | 109725213 A | 5/2019 |
| GB | 2287843 A | 9/1995 |

OTHER PUBLICATIONS

Chen, ba te er, et. al. Strong Tracking Filter Based Switching Converter Fault Diagnosis., Control Engineering, vol. 2, No. 19, pp. 320-323, Mar. 2012.

* cited by examiner

*Primary Examiner* — David Luo
(74) *Attorney, Agent, or Firm* — IPro, PLLC

(57) ABSTRACT

The disclosure relates to a fault detection method for a Buck converter based on an inverse Kalman filter, which belongs to the field of fault detection for power converters. The method includes: establishing a hybrid discrete model of a non-ideal Buck converter in Continuous Conduction Mode (CCM); acquiring a state equation and an observation equation of the Buck converter; acquiring the input voltage, the switching state, the inductive current and the output voltage in a working state, and determining the state matrix of the Buck converter; estimating a parameter matrix at time k according to the state matrix, the state equation and the observation equation; determining an estimated value of each component according to the estimated parameter matrix of the Buck converter at time k; and determining whether the Buck converter is faulty or not according to the estimated value of each component. The problems of poor real-time performance and low accuracy of fault diagnosis for the Buck converter at present are solved, and the real-time performance and accuracy of fault detection for the Buck converter are improved.

4 Claims, 9 Drawing Sheets

(58) Field of Classification Search
USPC .......................... 318/558; 324/546, 537, 500
See application file for complete search history.

FAULT DETECTION METHOD FOR BUCK CONVERTER BASED ON INVERSE KALMAN FILTER

TECHNICAL FIELD

The disclosure relates to a fault detection method for a Buck converter based on an inverse Kalman filter, and belongs to the field of fault detection for power converters.

BACKGROUND

As an important part of power system conversion, power converter can be used in power system, energy, automobiles, agriculture and so on. A power converter is usually composed of switching components, diodes, inductors, capacitors, and other devices. With the expansion of the application fields of electronic technology, converters will certainly continue to play an important role in various fields. A Buck converter is one type of the power converter, which is a step-down converter, namely a direct-current (DC) converter with an output voltage less than an input voltage.

During the use of the power converters, due to the degradation of electrolytic capacitors, the fault of switching tubes, the fault of solder joints and the like, chopper circuits are often faulty. In order to ensure the safe operation of the power converters, fault detection needs to be performed on the power converters.

Fault diagnosis methods can be divided into two categories: model-based fault diagnosis and data-driven fault diagnosis. The data-driven fault diagnosis method needs to take sufficient and reliable historical data as the premise, but the data collection process is often affected by different noises, the quality of collected data is not high and the real-time performance of fault diagnosis is not good. The model-based fault diagnosis method has low dependence on the data source and good real-time performance, but there are problems such as low accuracy in solving the change of equivalent resistor caused by degradation of electrolytic capacitor.

SUMMARY

In order to solve the problems that the conventional fault detection methods have poor real-time performance and low accuracy for the fault diagnosis of the Buck converter, the disclosure provides a fault detection method for a Buck converter based on an inverse Kalman filter. The method includes:

establishing a hybrid discrete model of a non-ideal Buck converter in Continuous Conduction Mode (CCM);

acquiring a state equation and an observation equation of the Buck converter according to the hybrid discrete model;

acquiring the input voltage, the switching state, the inductive current and the output voltage of the Buck converter in a working state, and determining the state matrix of the Buck converter;

estimating a parameter matrix X(k) of the Buck converter at time k according to the state matrix, the state equation and the observation equation based on the following formulas, elements in the parameter matrix being determined according to values of components in the Buck converter;

$\hat{X}(k|k) = \hat{X}(k|k-1) + K(k)\varepsilon(k)$;

$\hat{X}(k|k-1) = \hat{X}(k-1|k-1)$;

$K(k) = P(k|k-1)H^T(k) \cdot [H(k)P(k|k-1)H^T(k) + R_k]^{-1}$;

$\varepsilon(k) = Y(k) - H(k)\hat{X}(k|k-1)$;

$P(k|k-1) = P(k-1|k-1)/\lambda + \Gamma Q_{k-1}\Gamma^T$;

$P(k|k) = [I - K(k)H(k)]P(k|k-1)$;

determining an estimated value of each component in the Buck converter according to the estimated parameter matrix X(k) of the Buck converter at time k; and determining whether the Buck converter is faulty or not according to the estimated value of each component in the Buck converter, where the state equation is $X(k+1) = X(k) + W(k)$, and the observation equation is $Y(k) = H(k)X(k) + V(k)$;

X(k) represents the parameter matrix of the Buck converter at time k, Y(k) represents the observation matrix of the Buck converter at time k, H(k) represents the state matrix of the Buck converter at time k, V(k) represents an observation noise sequence of the Buck converter at time k, W(k) represents a process noise sequence of the Buck converter at time k, V(k) is independent of W(k), $\hat{X}(k|k)$ represents an optimal estimation result of the parameter matrix X(k) at time k, $\hat{X}(k|k-1)$ represents a result obtained by estimation using $\hat{X}(k-1|k-1)$, P(k|k) represents a covariance matrix corresponding to $\hat{X}(k|k)$ at time k, P(k|k-1) represents a covariance matrix corresponding to $\hat{X}(k|k-1)$, K(k) represents a Kalman filtering gain matrix at time k, $\Gamma$ represents a noise driving matrix, I represents a unit matrix, $\lambda$ represents a forgetting factor, and $\lambda=1$ or $0<\lambda<1$, k is an integer, and $\varepsilon(k)$ represents the innovation between the observed value and the estimated value at time k;

$$Y(k) = \begin{bmatrix} i_L(k) \\ u_O(k) \end{bmatrix},$$

$i_L(k)$ represents the inductive current of the Buck converter at time k, and $u_O(k)$ represents the output voltage of the Buck converter at time k;

$H(k) = [i_L(k-1) \cdot I_2 \, u_O(k-1) \cdot I_2 \, S(k) \cdot I_2]$, $I_2$ represents a two-dimensional unit matrix, and S(k) represents a switching state of a MOSFET tube in the Buck converter;

$$X(k) = \hat{X}(k|k) = [\hat{x}_{11}(k) \, \hat{x}_{12}(k) \, \hat{x}_{13}(k) \, \hat{x}_{14}(k) \, \hat{x}_{15}(k) \, \hat{x}_{16}(k)]^T$$
$$= \left[1 \, \frac{RT}{C(R+R_C)} \, -\frac{T}{L} \, 1 - \frac{(L+RR_CC)T}{LC(R+R_C)} \, \frac{ET}{L} \, \frac{RR_CET}{L(R+R_C)}\right]^T,$$

T represents a sampling period, E represents the input voltage of the Buck converter, R represents a value of a resistor in the Buck converter, L represents a value of an inductor in the Buck converter, an electrolytic capacitor in the Buck converter is equivalent to a capacitor and an equivalent resistor, C represents a value of the capacitor, and $R_C$ represents a value of the equivalent resistor.

Alternatively, determining whether the Buck converter is faulty or not according to the estimated value of each component in the Buck converter includes:

in a predetermined time range, detecting whether the difference between the estimated value and the reference value at the time k is within a predetermined range for each component in the Buck converter, the predetermined time range being 1 to N, N being an integer, and $1 \leq k \leq N$;

if it is detected that the difference between the estimated value and the reference value at the time k is within the predetermined range, determining that the component is fault-free;

if it is detected that the difference between the estimated value and the reference value at the time k is beyond the predetermined range, detecting whether the number of differences between the estimated values and the reference values from time k+1 to time k+j beyond the predetermined range is j, j being an integer;

if the number of the differences between the estimated values and the reference values from time k+1 to time k+j beyond the predetermined range is j, determining that the component is faulty; and if the number of the differences between the estimated values and the reference values from time k+1 to time k+j beyond the predetermined range is not j, determining that the component is fault-free.

Alternatively, determining the estimated value of each component in the Buck converter according to the estimated parameter matrix of the Buck converter at time k includes:

determining an estimated value of the inductor in the Buck converter at time k according to the following formula:

$$\hat{L}(k) = \frac{E \cdot T}{\hat{x}_{15}(k)};$$

determining an estimated value of the resistor in the Buck converter at time k according to the following formula:

$$\hat{R}(k) = \frac{\hat{x}_{12}(k) \cdot E}{E - \hat{x}_{14}(k) \cdot E - \hat{x}_{16}(k)};$$

and determining estimated values of the equivalent resistor and the capacitor for equivalence of the electrolytic capacitor in the Buck converter at time k according to the following formulas:

$$\hat{R}_C(k) = \frac{\hat{x}_{16}(k) \cdot \hat{R}(k) \cdot \hat{L}(k)}{\hat{R}(k) \cdot E \cdot T - \hat{x}_{16}(k) \cdot \hat{L}(k)};$$

$$\hat{C}(k) = \frac{\hat{L}(k) \cdot \hat{x}_{16}(k)}{E \cdot \hat{x}_{12}(k) \cdot \hat{R}_C(k)}.$$

Alternatively, determining whether the Buck converter is faulty or not according to the estimated value of each component in the Buck converter further includes:

drawing a parameter variation curve of the corresponding component according to the estimated value of each component in the Buck converter at each time; and determining a fault value when the corresponding component is faulty according to the parameter variation curve.

The beneficial effects of the disclosure are as follows:

In this application, a converter is abstracted into a type of Kalman filtering dynamic equation; component parameters of a circuit are taken as an unknown state of Kalman filter, the voltage and current of the circuit are taken as a known matrix and the recursive formulas of Kalman filter are reversely derived to complete parameter identification and fault diagnosis of a power converter. The fault detection method for the converter based on the inverse Kalman filter provided in this application can accurately identify component parameters of the power converter and diagnose the fault state of the components, and has the characteristics of strong follow ability, high accuracy and good real-time performance.

BRIEF DESCRIPTION OF FIGURES

In order to explain the technical solutions in the examples of the disclosure more clearly, the drawings used in the descriptions of the examples are briefly introduced below. It is apparent that the drawings in the following descriptions are just some examples of the disclosure. For those of ordinary skill in the art, other drawings can be obtained based on these drawings without paying creative labor.

DETAILED DESCRIPTION

To make the objectives, technical solutions and advantages of the disclosure clearer, the embodiments of the disclosure will be described in further detail below with reference to the accompanying drawings.

Example 1

Figure 1:
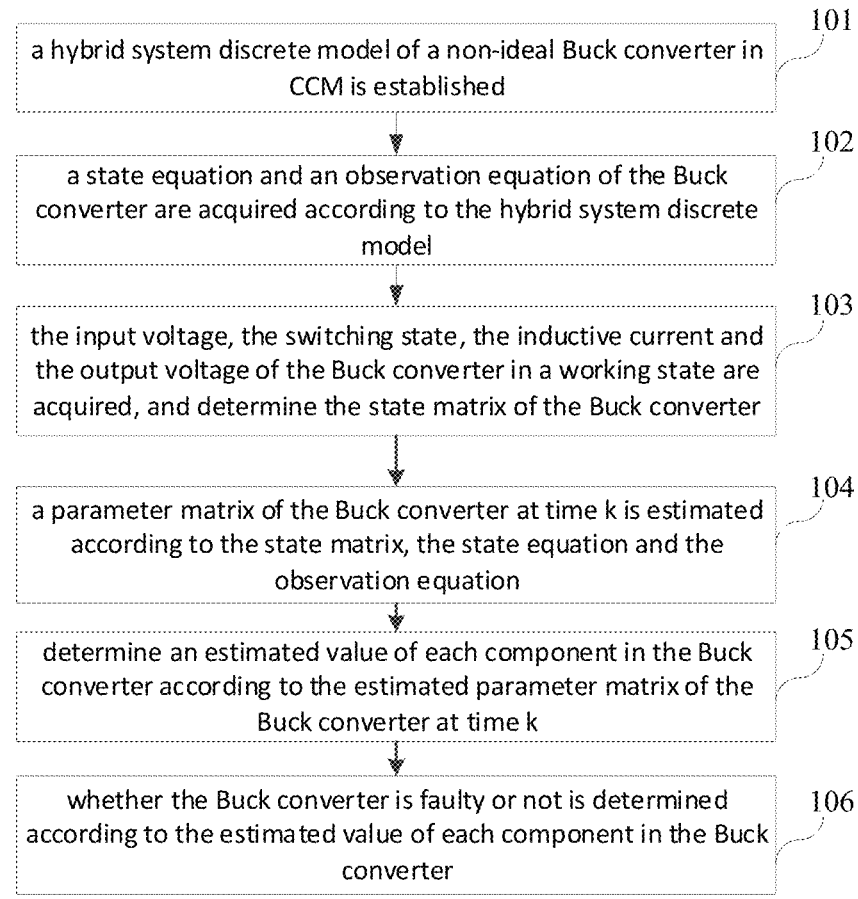
FIG. 1 is a flow chart of a fault detection method for a converter based on an inverse Kalman filter according to an exemplary example.

The present example provides a fault detection method for a Buck converter based on an inverse Kalman filter. Referring to FIG. 1, the method includes:

Step 101: a hybrid system discrete model of a non-ideal Buck converter in CCM is established.

Figure 2:
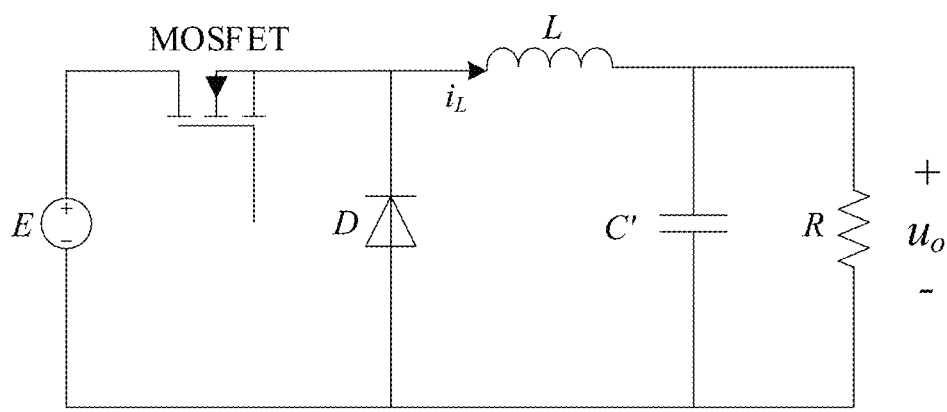
FIG. 2 is a topology diagram of a Buck converter.
Figure 3:
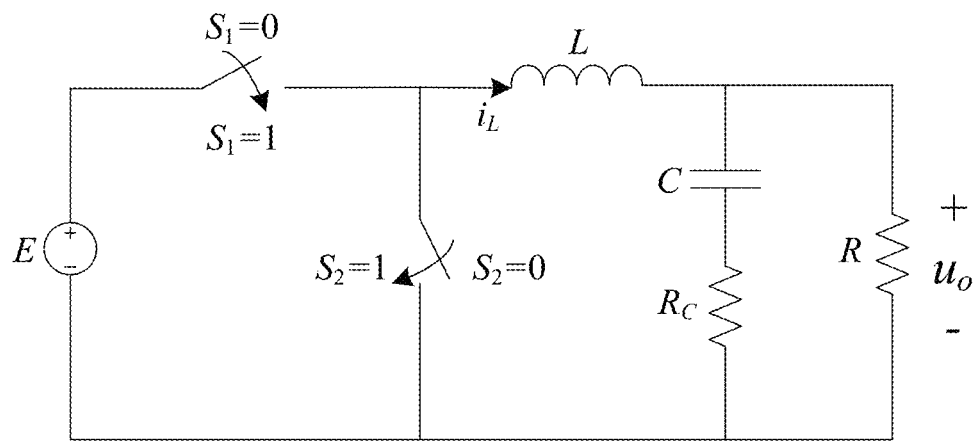
FIG. 3 is a topology schematic diagram of a non-ideal Buck converter.
Figure 4:
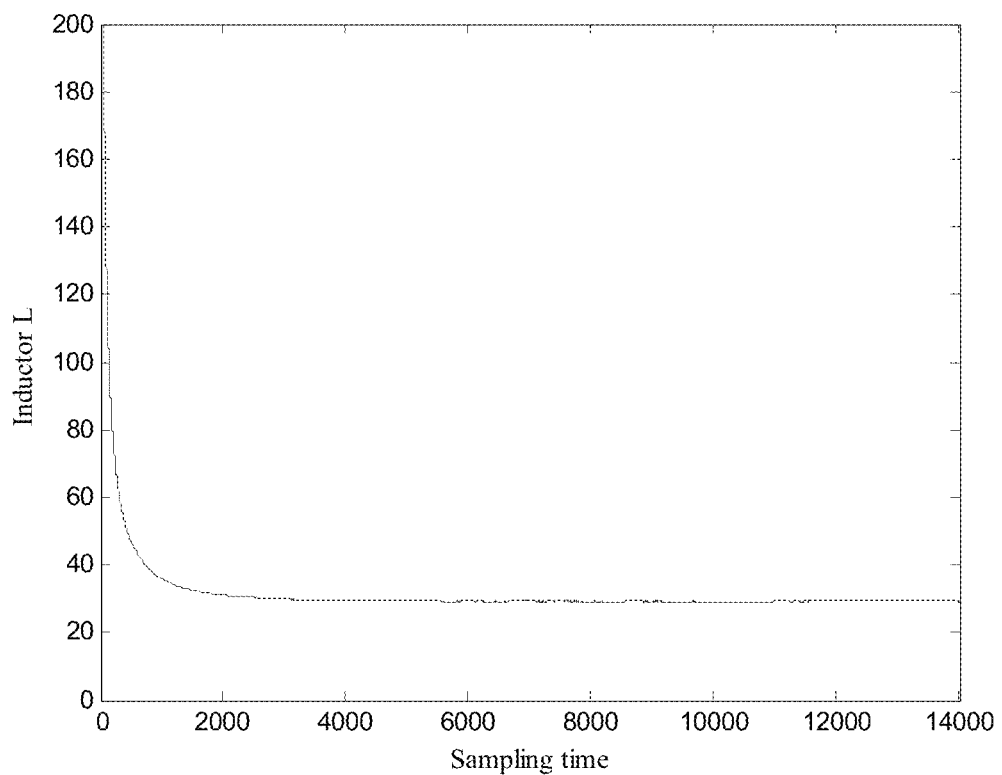
FIG. 4 is a parameter variation curve corresponding to an inductor L in a Buck converter according to an exemplary example.
Figure 5:
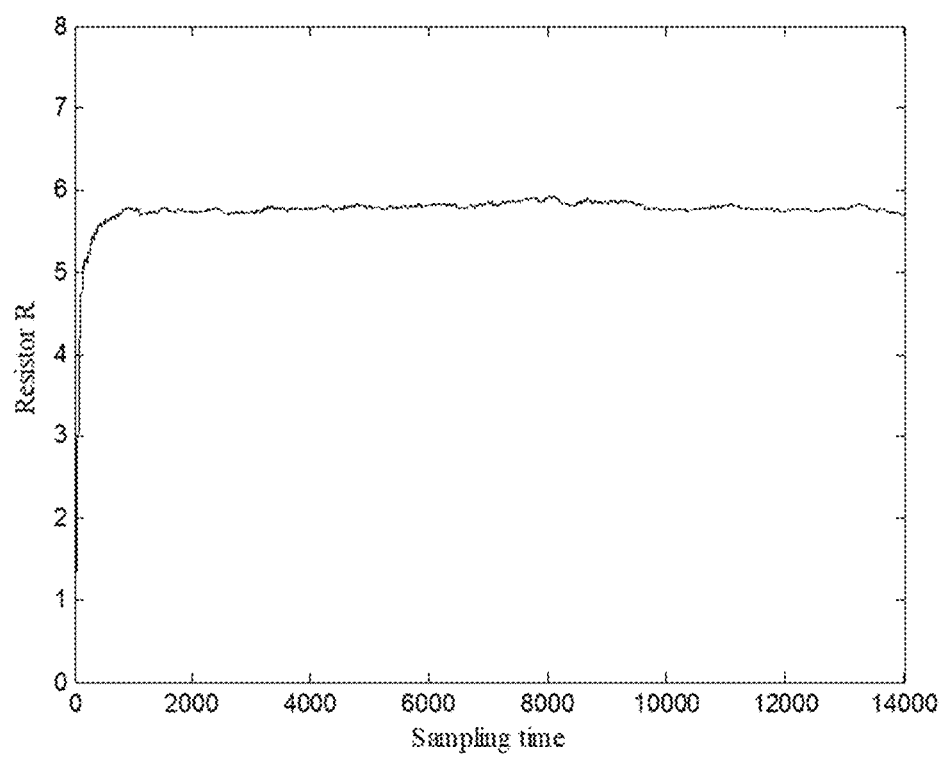
FIG. 5 is a parameter variation curve corresponding to a resistor R in a Buck converter according to an exemplary example.
Figure 6:
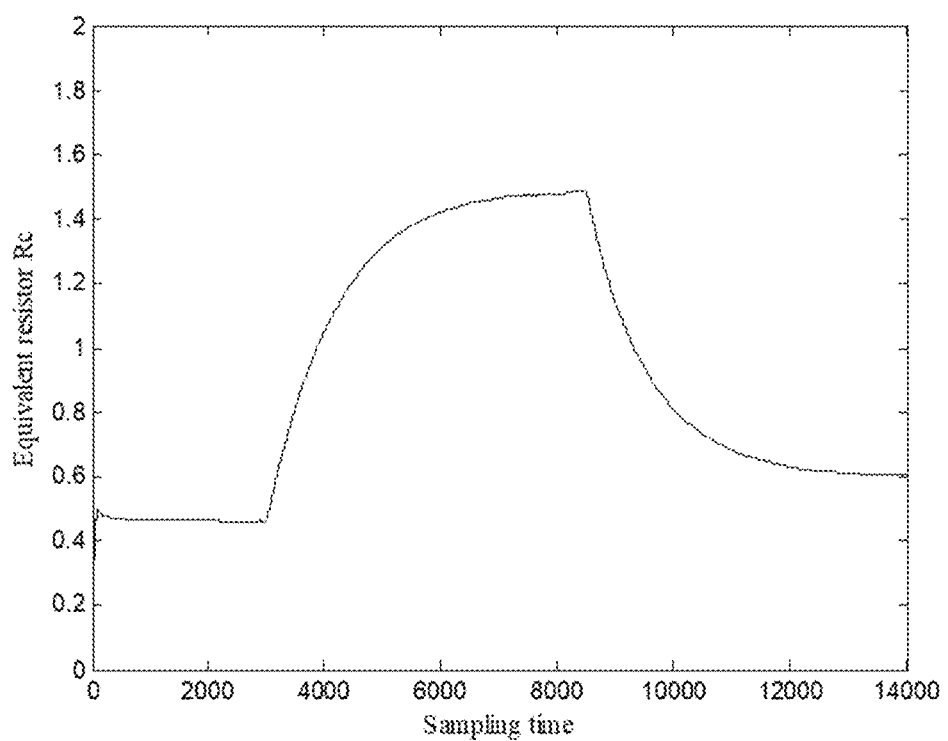
FIG. 6 is a parameter variation curve corresponding to an equivalent resistor $R_C$ in a Buck converter according to an exemplary example.
Figure 7:
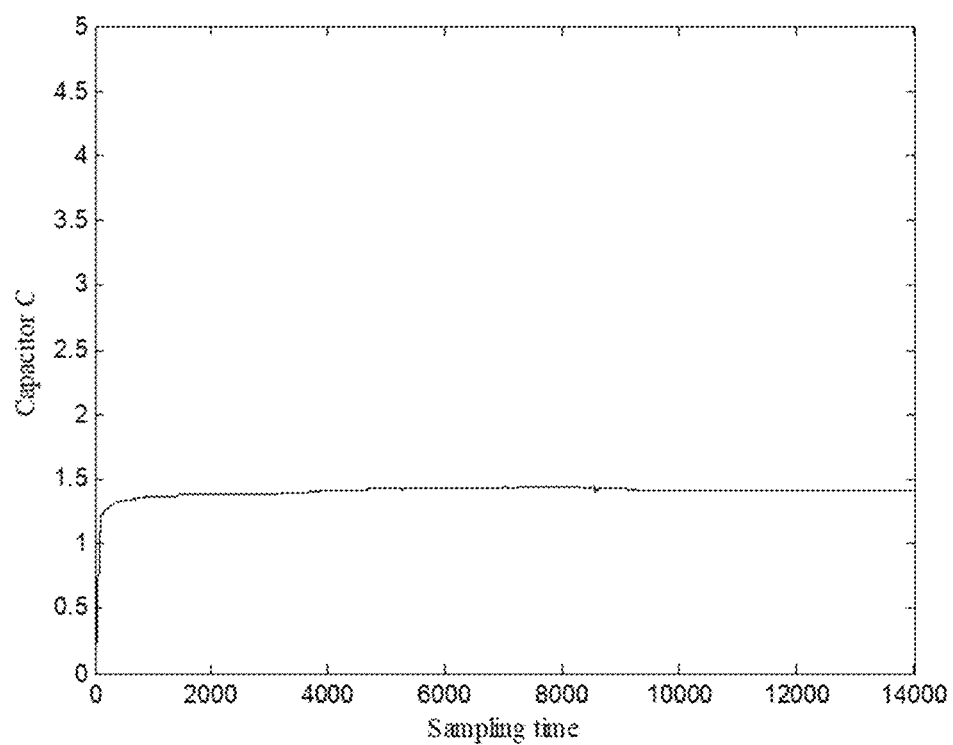
FIG. 7 is a parameter variation curve corresponding to a capacitor C in the Buck converter according to an exemplary example.

The topology diagram of a Buck converter is shown in FIG. 2. A method of equivalent conversion of a non-ideal Buck converter is used to simplify a Buck converter circuit. That is, a switching tube MOSFET is equivalent to an ideal switch S1, a diode D is equivalent to an ideal switch S2, an inductor L is regarded as an ideal component, and an electrolytic capacitor C' is equivalent to a capacitor C and an equivalent resistor $R_C$. The topology schematic diagram of the obtained non-ideal converter is shown in FIG. 3.

1. A hybrid system model of the non-ideal Buck converter is established.

There are two cases when the Buck converter is in CCM: S1 is turned on while S2 is turned off, and S1 is turned off while S2 is turned on. The states of the two cases are combined to obtain the hybrid system model of the Buck converter in CCM:

$$\begin{bmatrix} \dot{i}_L \\ \dot{u}_O \end{bmatrix} = \begin{bmatrix} 0 & -\frac{1}{L} \\ \frac{R}{C(R+R_C)} & -\frac{L+RR_CC}{CL(R+R_C)} \end{bmatrix} \begin{bmatrix} i_L \\ u_O \end{bmatrix} + S \begin{bmatrix} \frac{E}{L} \\ \frac{RR_CE}{L(R+R_C)} \end{bmatrix} \quad (1)$$

In formula (1), S represents a switching state of the switching tube of the Buck converter, E represents an input voltage of the Buck converter, $i_L$ represents an inductive current of the Buck converter, $u_o$ represents an output voltage of the Buck converter, $\dot{i}_L$ represents a first-order derivative of $i_L$ with respect to time t, and $\dot{u}_o$ represents a first-order derivative of $u_o$ with respect to the time t.

As shown in FIG. 3, components of the Buck converter include an inductor L, a resistor R, and a capacitor C and an equivalent resistor $R_C$ obtained by equivalence of an electrolytic capacitor C'.

2. Discretize formula (1) to obtain the hybrid discrete model of the non-ideal Buck converter in CCM:

$$\begin{bmatrix} i_L(k) \\ u_O(k) \end{bmatrix} = \begin{bmatrix} 1 & -\frac{T}{L} \\ \frac{RT}{C(R+R_C)} & 1 - \frac{(L+RR_CC)T}{CL(R+R_C)} \end{bmatrix} \begin{bmatrix} i_L(k-1) \\ u_O(k-1) \end{bmatrix} + \quad (2)$$

$$S(k) \begin{bmatrix} \frac{ET}{L} \\ \frac{RR_CET}{L(R+R_C)} \end{bmatrix}$$

In formula (2), T represents a sampling period, k is discrete time, $i_L(k)$ represents an inductive current of the Buck converter at time k, $u_O(k)$ represents an output voltage of the Buck converter at time k, S(k) represents a switching state of a MOSFET tube in the Buck converter, the value of S(k) in a period T is 1 or 0, when the value of S(k) is 1, it indicates that the MOSFET tube is on, and when the value of S(k) is 0, it indicates that the MOSFET tube is off.

Step 102: a state equation and an observation equation of the Buck converter are acquired according to the hybrid system discrete model.

According to the hybrid discrete model, namely formula (2), a state matrix H(k) of the Buck converter at time k, a parameter matrix X(k) of the Buck converter at time k and an observation matrix Y(k) of the Buck converter at time k are defined:

$$H(k) = [i_L(k-1) \cdot I_2 \quad u_O(k-1) \cdot I_2 \quad S(k) \cdot I_2] \quad (3)$$

$$X(k) = \begin{bmatrix} 1 & \frac{RT}{C(R+R_C)} & -\frac{T}{L} & 1 - \frac{(L+RR_CC)T}{LC(R+R_C)} & \frac{ET}{L} & \frac{RR_CET}{L(R+R_C)} \end{bmatrix}^T \quad (4)$$

$$Y(k) = \begin{bmatrix} i_L(k) \\ u_O(k) \end{bmatrix} \quad (5)$$

According to formulas (2), (3), (4) and (5), the following can be derived:

$$Y(k) = H(k)X(k) \quad (6)$$

$I_2$ represents a two-dimensional unit matrix; the unknown parameter matrix X(k) has 6 elements $x_{1i}(k)$, i=1, 2, ..., 6; the inductive current $i_L(k)$ and the output voltage $u_O(k)$ are the elements of the observation matrix Y(k), which can be obtained by measuring the Buck circuit.

It can be seen from formula (4) that the elements in the parameter matrix X(k) are determined according to values of the components in the Buck converter.

It is noted that the parameter with "^" represents an estimated value.

In a Kalman filtering algorithm, an estimated value of an unknown state of the system is obtained according to the known parameters in the system. In the example of the disclosure, an IKF algorithm is used, which obtains the estimated values of the unknown parameters in the system according to the known state of the system and obtains an unknown parameter matrix X(k) according to a known state matrix H(k).

According to formula (6), the unknown parameter matrix X(k) of the Buck converter is converted into the form of a state matrix, and the known state matrix H(k) of the Buck converter is converted into the form of a parameter matrix, namely:

A parameter $x_i(k)$ of the Buck converter at time k is set as:

$$x_i(k) = x_{1i}(k) \quad (7)$$

A parameter $x_i(k+1)$ of the Buck converter at time k+1 is set as:

$$x_i(k+1) = x_{1i}(k) + w_i(k) \quad (8)$$

where $w_i(k)$ is a Gaussian white noise sequence with a mean value of zero.

According to formula (8), a state equation of the Buck converter can be determined:

$$X(k+1) = X(k) + W(k) \quad (9)$$

where W(k) is a process noise sequence of the Buck converter at time k, W(k) consists of $w_i(k)$, and $E[W(k)W^T(i)] = Q_k\delta_{ki}$, $Q_k$ is a non-negative definite matrix, $Q_k$ is a variance matrix of the process noise sequence W(k), and $\delta_{ki}$ is a Kronecker δ function.

According to formula (6), an observation equation of the Buck converter can be determined:

$$Y(k) = H(k)X(k) + V(k) \quad (10)$$

V(k) represents an observation noise sequence of the Buck converter at time k, and V(k) is independent of W(k).

Step 103: the input voltage, the switching state, the inductive current and the output voltage of the Buck converter in a working state are acquired, and determine the state matrix of the Buck converter.

The input voltage, the switching state of the switch, the inductive current and the output voltage of the Buck converter in the working state are acquired within a predetermined time range.

The predetermined time range is 1 to N, N is an integer, and the value of N is preset.

Alternatively, obtain the input voltage E, the switching state S of the switch, the inductive current $i_L$, and the output voltage $u_O$ by measurement with voltmeter and sampling with oscilloscope in a Buck converter with unknown parameters, and the state of the Buck converter is obtained.

Then, the state matrix H(k) of the Buck converter is determined according to formula (3), where the value of k ranges from 1 to N, and k is an integer.

Step 104: a parameter matrix of the Buck converter at time k is estimated according to the state matrix, the state equation and the observation equation.

In a predetermined time range, the parameter matrix of the Buck converter at time k is estimated according to the state matrix, the state equation and the observation equation. The predetermined time range is 1 to N, N is an integer, and the value of N is preset. That is, the value of k ranges from 1 to N.

In the predetermined time range, the state matrix H(k) at time k can be determined through step 103.

Before estimating the parameter matrix of the Buck converter, a predicted covariance matrix P needs to be initialized.

Recursive calculations are performed according to formulas (11)-(16), and the parameter matrix X(k) of the Buck converter at time k is estimated.

$$\hat{X}(k|k)=\hat{X}(k|k-1)+K(k)\varepsilon(k) \quad (11)$$

$$\hat{X}(k|k-1)=\hat{X}(k-1|k-1) \quad (12)$$

$$K(k)=P(k|k-1)H^T(k)\cdot[H(k)P(k|k-1)H^T(k)+R_k]^{-1} \quad (13)$$

$$\varepsilon(k)=Y(k)-H(k)\hat{X}(k|k-1) \quad (14)$$

$$P(k|k-1)=P(k-1|k-1)/\lambda+\Gamma Q_{k-1}\Gamma^T \quad (15)$$

$$P(k|k)=[I-K(k)H(k)]P(k|k-1) \quad (16)$$

where $\hat{X}(k|k)$ represents an optimal estimation result of the parameter matrix X(k) at time k, $\hat{X}(k|k-1)$ represents a result obtained by estimation using $\hat{X}(k-1|k-1)$, P(k|k) represents a covariance matrix corresponding to $\hat{X}(k|k)$ at time k, P(k|k-1) represents a covariance matrix corresponding to $\hat{X}(k|k-1)$, K(k) represents a Kalman filtering gain matrix at time k, $R_k$ is a covariance matrix of the observation noise sequence V(k), I represents a unit matrix, $Q_{k-1}$ is a variance matrix of the process noise sequence W(k-1), $\Gamma$ represents a noise driving matrix, and $\Gamma$ is a unit matrix in the Buck converter system.

In formula (15), $\lambda$ represents a forgetting factor, and $\lambda=1$ or $0<\lambda<1$.

Because historical data will affect the fault detection results to a certain extent, if it is necessary to reduce the influence of the historical data on the detection results, set $0<\lambda<1$. If it is not necessary to reduce the influence of the historical data on the detection results, set $\lambda=1$.

The recursive process of parameter matrix estimation is:

(1) Predict the prediction result $\hat{X}(k|k-1)$ of the parameter matrix X at time k by using the optimal estimation result $\hat{X}(k-1|k-1)$ of the parameter matrix X at time k-1, namely formula (12).

(2) Predict the covariance matrix P(k|k-1) at time k by using the covariance matrix P(k-1|k-1) corresponding to $\hat{X}(k-1|k-1)$ at time k-1, namely formula (15).

(3) Calculate a Kalman filtering gain matrix K(k) at time k, namely formula (13).

(4) Calculate an innovation matrix $\varepsilon(k)$ at time k, namely formula (14), where $\varepsilon(k)$ represents an innovation between the observed value and the estimated value at time k.

(5) Update the optimal estimation result $\hat{X}(k|k)$ of the parameter matrix X at time k by using the prediction result $\hat{X}(k|k-1)$ of the parameter matrix X at time k, namely formula (11).

(6) Update a covariance matrix P(k|k) corresponding to $\hat{X}(k|k)$ at time k, namely formula (16).

The estimated parameter matrix X(k) of the Buck converter at time k is $\hat{X}(k|k)$, that is, $\hat{X}(k|k)=[\hat{x}_{11}(k) \; \hat{x}_{12}(k) \; \hat{x}_{13}(k) \; \hat{x}_{14}(k) \; \bar{x}_{15}(k) \; \hat{x}_{16}(k)]^T$.

Step 105: determine an estimated value of each component in the Buck converter according to the estimated parameter matrix of the Buck converter at time k.

$$X(k)=\left[1 \quad \frac{RT}{C(R+R_C)} \quad -\frac{T}{L} \quad 1-\frac{(L+RR_CC)T}{LC(R+R_C)} \quad \frac{ET}{L} \quad \frac{RR_CET}{L(R+R_C)}\right]^T,$$

that is, $$\hat{x}_{12}(k)=\frac{RT}{C(R+R_C)},$$

$$\hat{x}_{13}(k)=-\frac{T}{L},$$

$$\hat{x}_{14}(k)=1-\frac{(L+RR_CC)T}{LC(R+R_C)},$$

$$\hat{x}_{15}(k)=\frac{ET}{L}, \text{ and}$$

$$\hat{x}_{16}(k)=\frac{RR_CET}{L(R+R_C)},$$

so that the estimated value of each component in the Buck converter can be determined according to elements in the parameter matrix.

Specifically:

An estimated value $\hat{L}(k)$ of the inductor in the Buck converter at time k is determined according to formula (17):

$$\hat{L}(k)=\frac{E\cdot T}{\hat{x}_{15}(k)} \quad (17)$$

An estimated value $\hat{R}(k)$ of the resistor in the Buck converter at time k is determined according to formula (18):

$$\hat{R}(k)=\frac{\hat{x}_{12}(k)\cdot E}{E-\hat{x}_{14}(k)\cdot E-\hat{x}_{16}(k)} \quad (18)$$

The estimated values of the equivalence of the electrolytic capacitor in the Buck converter at time k are determined according to formulas (19) and (20), namely the equivalent resistor $\hat{R}_C(k)$ and the capacitor $\hat{C}(k)$:

$$\hat{R}_C(k)=\frac{\hat{x}_{16}(k)\cdot \hat{R}(k)\cdot \hat{L}(k)}{\hat{R}(k)\cdot E\cdot T-\hat{x}_{16}(k)\cdot \hat{L}(k)} \quad (19)$$

$$\hat{C}(k)=\frac{\hat{L}(k)\cdot \hat{x}_{16}(k)}{E\cdot \hat{x}_{12}(k)\cdot \hat{R}_C(k)} \quad (20)$$

Step 106: whether the Buck converter is faulty or not is determined according to the estimated value of each component in the Buck converter.

According to the estimated value, the faulty component and its parameter value in the Buck converter can be determined in real time.

Prior to fault diagnosis, the reference value for each component is known.

In a predetermined time range, whether a difference between the estimated value and the reference value at time k is within a predetermined range is detected for each component in the Buck converter.

Alternatively, the predetermined range is preset, and the predetermined range is determined according to actual needs.

The predetermined time range is 1 to N, N is an integer, and 1≤k≤N. The estimated value at each time within the predetermined time range is compared with the reference value, and whether the difference between the estimated value and the reference value is within the predetermined range is detected.

If it is detected that the difference between the estimated value and the reference value at time k is within the predetermined range, it is determined that the component is fault-free.

If it is detected that the difference between the estimated value and the reference value at time k is beyond the predetermined range, detecting whether the number of differences between estimated values and the reference values at time k+1 to time k+j beyond the predetermined range is j, j being an integer.

Whether the difference between the estimated value and the reference value at time k+1 is within the predetermined range, whether the difference between the estimated value and the reference value at time k+2 is within the predetermined range, whether the difference between the estimated value and the reference value at time k+3 is within the predetermined range, . . . , whether the difference between the estimated value and the reference value at time k+j is within the predetermined range are detected sequentially; and whether the number of the differences between the estimated values and the reference values beyond the predetermined range is j is detected.

If it is detected that the number of the differences between the estimated values and the reference values from time k+1 to time k+j beyond the predetermined range is j, it is determined that the component is faulty.

If it is detected that the number of the differences between the estimated values and the reference values from time k+1 to time k+j beyond the predetermined range is not j, it is determined that the component is fault-free.

The value of j is preset, and the value of j is determined according to actual needs, for example, j=5.

After determining the faulty component, a stable estimated value finally obtained within the predetermined time range is determined as a fault value of the faulty component.

Alternatively, in the predetermined time range, a parameter variation curve of the component is drawn according to the estimated value of the component for each component in the Buck converter, that is, the parameter variation curves of the components are drawn respectively for the inductor, the resistor, the equivalent resistor and the capacitor.

Get the estimated value of the component at each time intuitively according to the parameter variation curve of the component. Get the faulty component intuitively according to the fluctuation and jumping state of the parameter variation curve of the component. Obtain the fault value of the faulty component from the final stable value of the parameter variation curve.

In summary, according to the examples of the disclosure, a hybrid discrete model of a non-ideal Buck converter in a working state is established. A state equation and an observation equation of the Buck converter are acquired according to the hybrid discrete model; values of the input voltage, the switching state of switch, the inductive current and the output voltage of the Buck converter during working are acquired, and the state matrix of the Buck converter is determined according to the obtained values; a parameter matrix of Buck at each time is estimated according to the state matrix, the state equation and the observation matrix within a predetermined time range; an estimated value of each component in the Buck converter is determined according to each element in the estimated parameter matrix; and whether the Buck converter is faulty or not is determined according to the estimated value of the component. The problems of poor real-time performance and low accuracy of fault diagnosis for the Buck converter at present are solved, and the effect of improving the real-time performance and accuracy of fault detection for the Buck converter is achieved.

In addition, the fault value can also be determined when the component is faulty, and the characteristics of high reliability and strong follow ability are realized.

It is noted that the parameter with "^" in the examples of the disclosure represents an estimated value.

In an alternative example based on the example shown in FIG. 1, if the influence of historical data on component parameter estimation is not considered, the forgetting factor is set as λ=1. When step 104 is performed, the parameter matrix X(k) of the Buck converter at time k is iteratively calculated within the predetermined time range by the following formulas:

$$\hat{X}(k|k)=\hat{X}(k|k-1)+K(k)\varepsilon(k);$$

$$\hat{X}(k|k-1)=\hat{X}(k-1|k-1);$$

$$K(k)=P(k|k-1)H^T(k)\cdot[H(k)P(k|k-1)H^T(k)+R_k]^{-1};$$

$$\varepsilon(k)=Y(k)-H(k)\hat{X}(k|k-1);$$

$$P(k|k-1)=P(k-1|k-1)+\Gamma Q_{k-1}\Gamma^T;$$

$$P(k|k)=[I-K(k)H(k)]P(k|k-1).$$

In an alternative example based on the example shown in FIG. 1, if the influence of historical data on component parameter estimation is considered, then the fault detection results are more accurate, and the forgetting factor is set as 0<λ<1. When step 104 is performed, the parameter matrix X(k) of the Buck converter at time k is iteratively calculated within the predetermined time range by formulas (11)-(16).

The forgetting factor λ is artificially preset according to actual needs. Alternatively, the value of the forgetting factor λ is between 0.95 and 1, for example, λ=0.9989.

In one example, the forgetting factor is set as λ=0.9989, in a predetermined time range, an estimated value at each time within the predetermined time range is obtained after step 101 to step 106 are performed, and it is determined that the inductor L, the resistor R and the capacitor C in the Buck converter are fault-free and the equivalent resistor $R_C$ is faulty. According to the estimated value of each component, parameter variation curves corresponding to the inductor L, the resistor R, the equivalent resistor $R_C$ and the capacitor C in the Buck converter are drawn, as shown in FIG. 4, FIG. 5, FIG. 6 and FIG. 7, respectively. It can be seen from FIG. 6 that the parameter variation curve corresponding to the faulty equivalent resistor $R_C$ has obvious fluctuations and the value continues to rise and fall within a certain period of time.

It is noted that according to the fault detection method for the Buck converter based on the inverse Kalman filter provided by the example of the disclosure, whether the Buck converter is faulty or not is detected as long as the Buck converter is in a working state, and it is assumed that only a single component of the Buck converter is faulty at one time.

In order to verify the real-time performance and accuracy of the fault detection method for the Buck converter based on the inverse Kalman filter provided by the example of this application, the following simulation experiments were performed. The experimental process was implemented on a Lenovo 90CYCTO1WW-model computer using Intel Core 4 quad-core processor based on a Matlab2016 simulation environment. The related parameters of a Buck converter model set in the simulation experiments are shown in Table 1:

TABLE 1

Parameters of Buck converter simulation model

| Physical Variable | Standard Value |
|---|---|
| Input Voltage E | 50 V |
| Capacitor C | 144.3 μF |
| Inductor L | 292 μH |
| Working Frequency f | 50 kHz |
| Duty Ratio D | 0.5 |
| Resistor R | 5.76 Ω |
| Equivalent Resistor $R_c$ | 0.46 Ω |

The Buck converter model was simulated on a Simulink interface according to the set parameters. A simulation time was set to be 0.03 s and a sampling time $T_S$ was set to be 0.00001 s. And 3000 groups of waveforms and values of inductive current and output voltage of Buck converter were obtained. The obtained values were used to perform IKF parameter identification. The obtained parameter estimation results and errors of the components are shown in Table 2.

TABLE 2

Parameter identification results of Buck converter based on IKF algorithm in fault-free state

| Number of Samples | Inductor L/μH | Resistor R/Ω | Equivalent Resistor $R_c$/Ω | Capacitor C/μF |
|---|---|---|---|---|
| 100 | 405.51 | 5.31 | 0.450 7 | 136.45 |
| 200 | 349.11 | 5.59 | 0.456 6 | 142.20 |
| 300 | 331.32 | 5.66 | 0.456 7 | 143.39 |
| 400 | 321.97 | 5.64 | 0.457 4 | 143.58 |
| 500 | 316.19 | 5.65 | 0.457 9 | 143.85 |
| 1 000 | 303.95 | 5.71 | 0.459 6 | 144.87 |
| 1 500 | 300.12 | 5.75 | 0.459 3 | 145.36 |
| 2 000 | 297.96 | 5.73 | 0.460 0 | 145.31 |
| 2 500 | 297.64 | 5.73 | 0.458 1 | 145.30 |
| 3 000 | 296.46 | 5.74 | 0.459 0 | 145.45 |
| True Value | 292.00 | 5.76 | 0.460 0 | 144.30 |
| Error | 1.53% | 0.35% | 0.22% | 0.80% |

It can be seen from Table 2 that with an increase of the number of samples, the parameter values L, R, $R_c$ and C of the components gradually approach standard values of the components, and errors between final parameter identification values of the components and the standard values of the components are small, which indicates that the IKF algorithm is suitable for parameter identification of the Buck converter in a fault-free state and the accuracy of parameter identification results is high.

Figure 8:
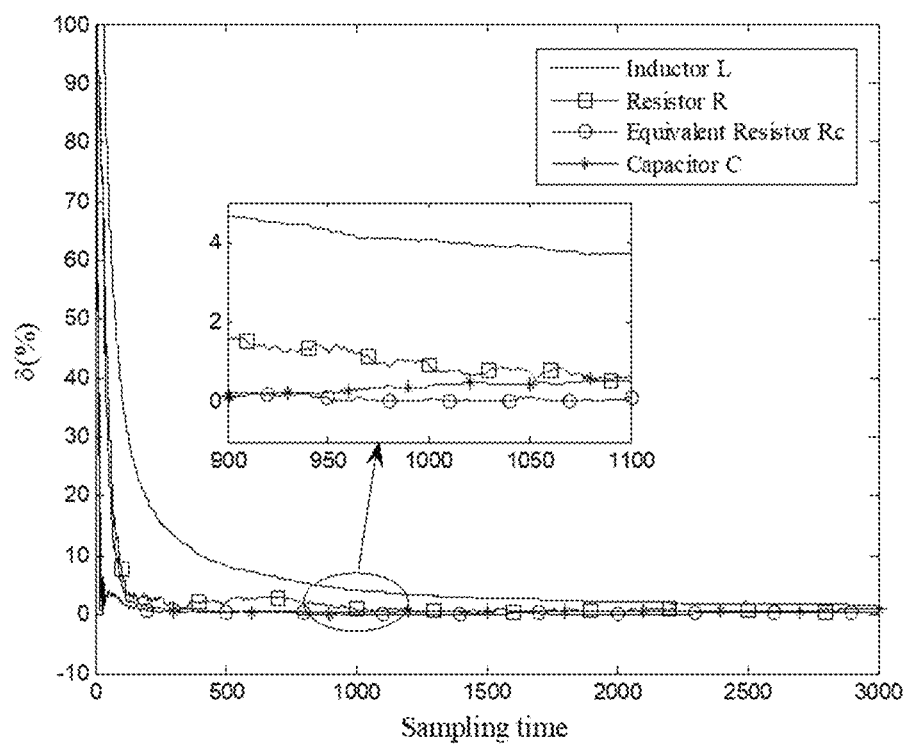
FIG. 8 is a simulation result diagram of parameter identification errors of components of a Buck converter based on an Inverse Kalman Filtering (IKF) algorithm in a fault-free state.

It can be seen from FIG. 8 that the identification error curves vary rapidly when the number of samples varies from 0 to 1000. When the number of samples is 1000, all component identification errors have decreased to be less than 5%, and then gradually tend to be stable.

Based on the same simulation conditions, the IKF algorithm and a Recursive Least Squares (RLS) algorithm proposed in this application are compared. The parameter identification results and errors of Buck converter in a fault-free state are shown in Table 3. For the RLS algorithm, please refer to "Zhang Wenyuan. Research on FESS sensorless control based on recursive least-squares discrete identification [J]. Power System Protection and Control, 2018 46 (18): 135-141.".

Analysis of Table 3 shows that the identification error of the inductor in the identification results of the IKF algorithm is slightly larger than that in the RLS algorithm for a Buck converter in a fault-free state, but compared to the RLS algorithm, the accuracy of the identification result of the capacitor in the IKF algorithm is significantly higher, which indicates that the IKF algorithm is more sensitive to capacitor variation and is more suitable for fault diagnosis of the degradation of electrolytic capacitor in the Buck converter to be studied in this application.

TABLE 3

Comparison between parameter identification results of two algorithms in fault-free state

| Algorithm | Number of Samples | Inductor L/μH | Resistor R/Ω | Equivalent Resistor $R_c$/Ω | Capacitor C/μF |
|---|---|---|---|---|---|
| IKF | 200 | 349.11 | 5.59 | 0.456 6 | 142.20 |
| | 500 | 316.19 | 5.65 | 0.457 9 | 143.85 |
| | 1 000 | 303.95 | 5.71 | 0.459 6 | 144.87 |
| | 2 000 | 297.96 | 5.73 | 0.460 0 | 145.31 |
| | 3 000 | 296.46 | 5.74 | 0.459 0 | 145.45 |
| | True Value | 292.00 | 5.76 | 0.460 0 | 144.30 |
| | Error | 1.53% | 0.35% | 0.22% | 0.80% |
| RLS | 200 | 294.99 | 5.71 | 0.453 5 | 145.97 |
| | 500 | 293.69 | 5.67 | 0.456 7 | 145.59 |
| | 1 000 | 292.56 | 5.72 | 0.459 0 | 146.00 |
| | 2 000 | 292.22 | 5.73 | 0.459 7 | 146.14 |
| | 3 000 | 292.60 | 5.74 | 0.458 8 | 146.18 |
| | True Value | 292.00 | 5.76 | 0.460 0 | 144.30 |
| | Error | 0.21% | 0.35% | 0.26% | 1.30% |

In order to verify the applicability of this application to a Buck converter in the fault state of electrolytic capacitor, the fault caused by degradation of the electrolytic capacitor in the Buck converter is set to be a sudden change in $R_C$. Specifically, the value of $R_C$ is set to suddenly vary from 0.46Ω to 0.8Ω when the number of samples is 3000, and then suddenly vary from 0.8Ω to 1.5Ω when the number of samples is 7500. The simulation time is set to be 0.15 s, other simulation experiment conditions and component parameters are the same as those in the above-mentioned fault-free state, and the parameter identification curves of an equivalent resistor $R_C$ under different forgetting factors is shown in FIG. 9.

Figure 9:
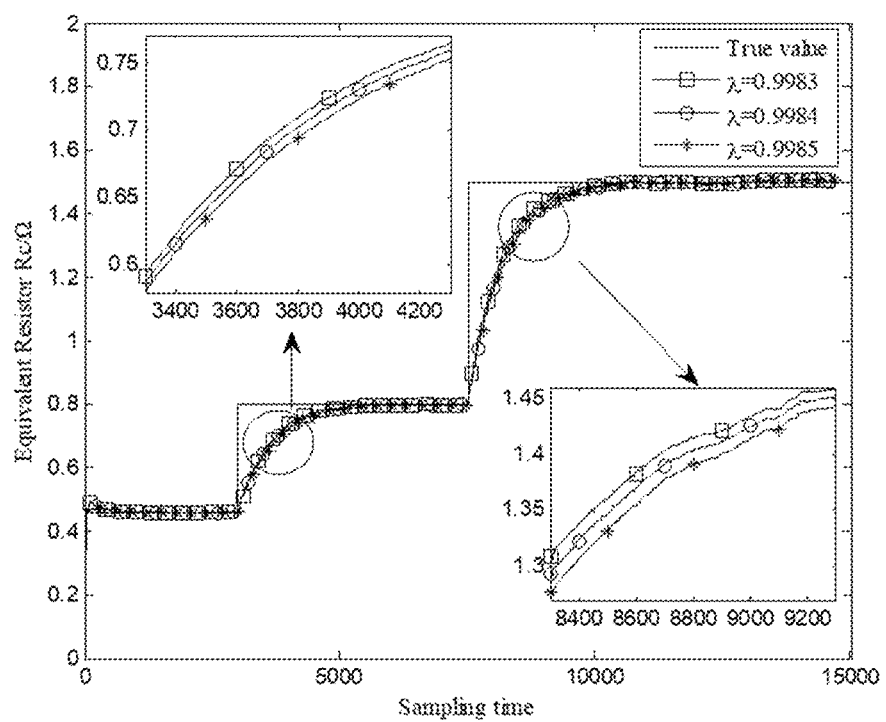
FIG. 9 is the equivalent resistor identification curves based on the IKF algorithm in fault states.
Figure 10:
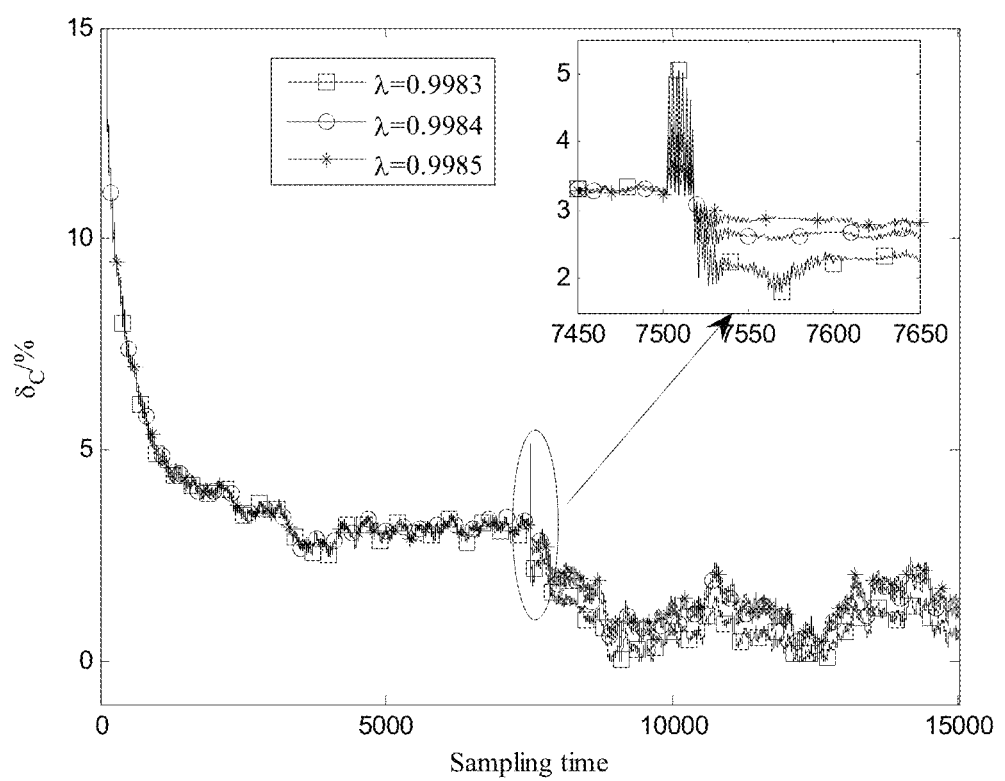
FIG. 10 is the identification error curves of a capacitor based on an IKF algorithm in fault states.

Analysis of FIG. 9 shows that the identification curves of $R_C$ based on the IKF algorithm under different forgetting factors can track the variation curve of $R_C$ in the ideal state well, and the fitting degree of the curves is better as the forgetting factor decreases. At the same time, considering that the degradation of the electrolytic capacitor will have a larger influence on the capacitor, the capacitor variation is also analyzed below when the equivalent resistor varies, parameter identification values of the equivalent resistor and identification errors of the capacitor based on different forgetting factors in the fault state of electrolytic capacitor in the Buck converter are shown in Table 4, and the corresponding identification error variation curves of the capacitor are shown in FIG. 10.

In addition, the final fault values corresponding to the two faults shown in FIG. 9 are different. Therefore, according to different fault values, the types of faults can be distinguished, so that the faults can be targeted for subsequent repair, and the time of fault repair can be reduced as much as possible. For example, a person skilled in the art can determine whether the component should be repaired or replaced directly according to the fault values, which saves time for early judgment of fault repair.

TABLE 4

Equivalent resistor identification values and capacitor identification errors based on IKF algorithm in fault states

| Number of Samples | Equivalent Resistor $R_r/\Omega$ | | | Capacitor error/% | | |
|---|---|---|---|---|---|---|
| | $\lambda = 0.998\,3$ | $\lambda = 0.998\,4$ | $\lambda = 0.998\,5$ | $\lambda = 0.998\,3$ | $\lambda = 0.998\,4$ | $\lambda = 0.998\,5$ |
| 1 000 | 0.463 9 | 0.463 9 | 0.464 0 | 4.918 0 | 5.008 2 | 5.101 7 |
| 2 000 | 0.457 6 | 0.457 7 | 0.457 8 | 3.966 5 | 4.008 6 | 4.055 3 |
| 3 000 | 0.462 1 | 0.462 0 | 0.461 9 | 3.473 8 | 3.502 7 | 3.534 8 |
| 4 000 | 0.735 8 | 0.729 2 | 0.721 9 | 2.522 8 | 2.546 0 | 2.575 2 |
| 6 000 | 0.798 1 | 0.797 4 | 0.796 5 | 3.260 4 | 3.236 7 | 3.214 2 |
| 7 500 | 0.797 8 | 0.797 8 | 0.797 7 | 3.270 0 | 3.252 2 | 3.235 0 |
| 10 000 | 1.489 2 | 1.485 9 | 1.481 7 | 0.689 4 | 1.162 3 | 1.343 9 |
| 15 000 | 1.500 2 | 1.500 5 | 1.500 7 | 0.658 1 | 1.192 3 | 1.418 4 |

It can be seen from Table 4 and FIG. 10 that the variation in the equivalent resistor has a certain influence on the value of the capacitor, but the influence is small. The stable values of the capacitor identification errors under different forgetting factors are less than 5%, which has no influence on the fault diagnosis results of the Buck converter. At the same time, the larger the accumulated step size is, the greater the influence of historical data on the identification curve will be. Therefore, the curve fluctuation is small at the first fault occurrence point in FIG. 10, namely when the number of samples is 3000, and the curve fluctuates sharply at a second fault occurrence point, namely when the number of samples is 7500. At the same time, it can be seen from FIG. 9 and FIG. 10 that different forgetting factors will affect the follow ability and stability of the fault diagnosis variation curve to a certain extent. When the forgetting factor is 0.9983, the follow ability of the identification curve of the equivalent resistor is the best. However, the identification error variation curve of the capacitor under this forgetting factor fluctuates more sharply at around 7500 samples compared to the other two curves. But at the same time, it can be seen that the variation curves of capacitor identification error under different forgetting factors fluctuate about the same after the number of sample is 7550, and when the forgetting factor is 0.9983, the capacitor identification error is smaller than the other two cases. Therefore, it is concluded that the fault diagnosis result is optimal when the forgetting factor is 0.9983.

Considering that the degradation of the electrolytic capacitor will have a certain influence on the size of the capacitor, the IKF algorithm and the RLS algorithm are used to perform fault diagnosis on the Buck converter in the fault state. The identification error curves of the capacitor are shown in FIG. 11, where the forgetting factors in both algorithms are 0.9983.

Figure 11:
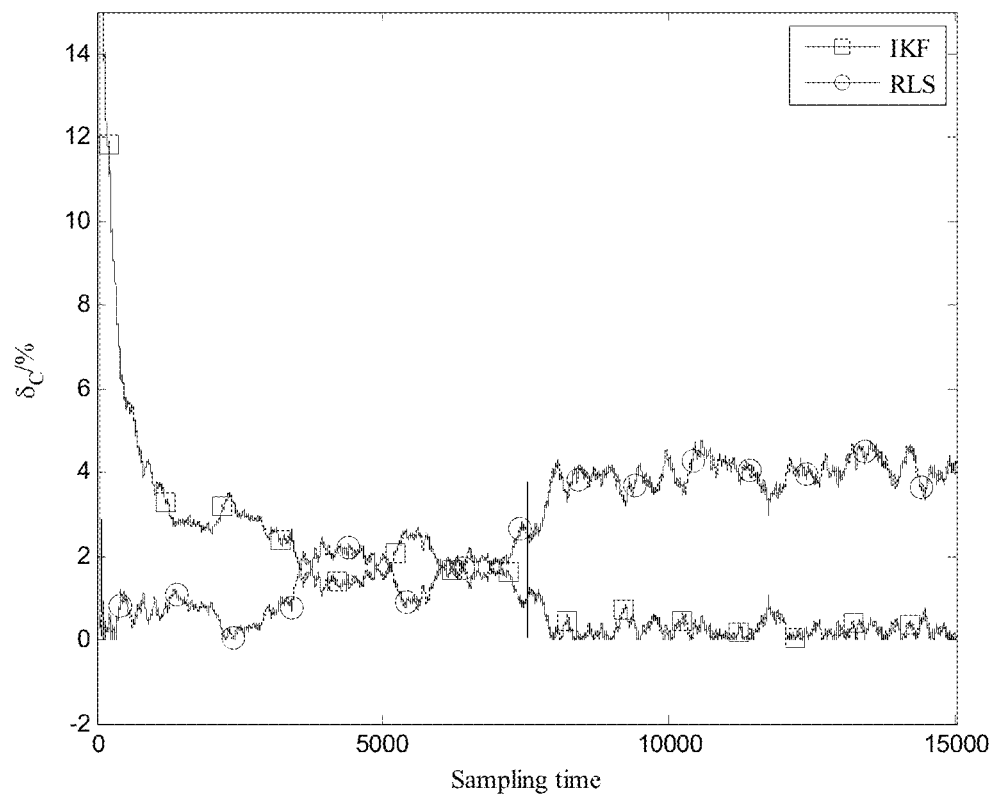
FIG. 11 is a comparison diagram of the capacitor identification errors of two algorithms in fault states.

It can be seen from FIG. 11 that the parameter identification error of the capacitor of the IKF algorithm is larger than that of the RLS algorithm when the number of samples is small, but with the increase of the number of samples, the capacitor error gradually decreases and approaches zero. The capacitor identification error of the RLS algorithm gradually increases with the increase of the number of samples, the fault diagnosis result of the system will be adversely affected. Therefore, it can be seen that the IKF algorithm is better than the RLS algorithm in identifying the capacitor parameter of the fault of equivalent resistor when the electrolytic capacitor is degraded.

Aiming at the problem of parameter identification and fault diagnosis of the power converters, this application proposes a type of IKF fault diagnosis algorithm, which reverses the traditional Kalman filtering recursive process, uses current and voltage data to construct a known matrix, and reversely derives the Kalman recursive algorithm by using parameters of circuit components as unknown quantities. Simulation experiment results and analysis show that the algorithm can accurately identify the component parameters of the power converters and diagnose the fault state of components, and has the characteristics of strong follow ability, high accuracy and good real-time performance. Moreover, the method of this application can not only determine the fault device, but also directly determine the fault value when the corresponding component is faulty according to a parameter variation curve of each component, so that the fault can be repaired in a targeted manner. At the same time, compared to the RLS algorithm, the IKF algorithm has the advantages of higher accuracy and better adaptability in fault diagnosis based on electrolytic capacitors of power converters.

Some steps in the examples of the disclosure can be implemented by software, and corresponding software programs can be stored in a readable storage medium, such as an optical disc or a hard disk.

What is claimed is:

1. A fault detection method for a Buck converter based on an inverse Kalman filter, comprising:
    establishing a hybrid discrete model of a non-ideal Buck converter in a Continuous Conduction Mode (CCM);
    acquiring a state equation and an observation equation of the Buck converter according to the hybrid discrete model;
    acquiring an input voltage, a switching state, an inductive current and an output voltage of the Buck converter in a working state, and determining a state matrix of the Buck converter;
    estimating a parameter matrix X(k) of the Buck converter at time k according to the state matrix, the state equation and the observation equation based on the following formulas, elements in the parameter matrix being determined according to values of components in the Buck converter;

$\hat{X}(k|k)=\hat{X}(k|k-1)+K(k)\varepsilon(k)$;

$\hat{X}(k|k-1)=\hat{X}(k-1|k-1)$;

$K(k)=P(k|k-1)H^T(k)\cdot[H(k)P(k|k-1)H^T(k)+R_k]^{-1}$;

$\varepsilon(k)=Y(k)-H(k)\hat{X}(k|k-1)$;

$P(k|k-1)=P(k-1|k-1)/\lambda+\Gamma Q_{k-1}\Gamma^T$;

$P(k|k)=[I-K(k)H(k)]P(k|k-1)$;

determining an estimated value of each component in the Buck converter according to the estimated parameter matrix X(k) of the Buck converter at time k; and determining whether the Buck converter is faulty or not according to the estimated value of each component in the Buck converter, wherein the state equation is X(k+1)=X(k)+W(k), and the observation equation is Y(k)=H(k)X(k)+V(k);

X(k) represents the parameter matrix of the Buck converter at time k, Y(k) represents an observation matrix of the Buck converter at time k, H(k) represents a state matrix of the Buck converter at time k, V(k) represents an observation noise sequence of the Buck converter at time k, W(k) represents a process noise sequence of the Buck converter at time k, V(k) is independent of W(k), $\hat{X}(k|k)$ represents an optimal estimation result of the parameter matrix X(k) at time k, $\hat{X}(k|k-1)$ represents a result obtained by estimation using $\hat{X}(k-1|k-1)$, P(k|k) represents a covariance matrix corresponding to $\hat{X}(k|k)$ at time k, P(k|k-1) represents a covariance matrix corresponding to $\hat{X}(k|k-1)$, K(k) represents a Kalman filtering gain matrix at time k, Γ represents a noise driving matrix, I represents a unit matrix, λ represents a forgetting factor, and λ=1 or 0<λ<1, k is an integer, and ε(k) represents an innovation between an observed value and the estimated value at time k;

$$Y(k) = \begin{bmatrix} i_L(k) \\ u_O(k) \end{bmatrix},$$

$i_L(k)$ represents the inductive current of the Buck converter at time k, and $u_O(k)$ represents the output voltage of the Buck converter at time k;

$$H(k)=[i_L(k-1)\cdot I_2 u_O(k-1)\cdot I_2 S(k)\cdot I_2],$$

$I_2$ represents a two-dimensional unit matrix, and S(k) represents a switching state of a MOSFET tube in the Buck converter;

$$X(k) = \hat{X}(k|k) = [\hat{x}_{11}(k) \ \hat{x}_{12}(k) \ \hat{x}_{13}(k) \ \hat{x}_{14}(k) \ \hat{x}_{15}(k) \ \hat{x}_{16}(k)]^T$$
$$= \left[1 \ \frac{RT}{C(R+R_C)} \ -\frac{T}{L} \ 1-\frac{(L+RR_CC)T}{LC(R+R_C)} \ \frac{ET}{L} \ \frac{RR_CET}{L(R+R_C)}\right]^T,$$

T represents a sampling period, E represents the input voltage of the Buck converter, R represents a value of a resistor in the Buck converter, L represents a value of an inductor in the Buck converter, an electrolytic capacitor in the Buck converter is equivalent to a capacitor and an equivalent resistor, C represents a value of the capacitor, and $R_C$ represents a value of the equivalent resistor.

2. The fault detection method according to claim 1, wherein determining whether the Buck converter is faulty or not according to the estimated value of each component in the Buck converter comprises:

in a predetermined time range, detecting whether a difference between the estimated value and a reference value at time k is within a predetermined range for each component in the Buck converter or not, the predetermined time range being 1 to N, N being an integer, and 1≤k≤N;

if it is detected that the difference between the estimated value and the reference value at time k is within the predetermined range, determining that the component is fault-free;

if it is detected that the difference between the estimated value and the reference value at time k is beyond the predetermined range, detecting whether the number of differences between estimated values and reference values from time k+1 to time k+j beyond the predetermined range is j or not, j being an integer;

if the number of the differences between the estimated values and the reference values from time k+1 to time k+j beyond the predetermined range is j, determining that the component is faulty; and if the number of the differences between the estimated values and the reference values from time k+1 to the time k+j beyond the predetermined range is not j, determining that the component is fault-free.

3. The fault detection method according to claim 1, wherein determining the estimated value of each component in the Buck converter according to the estimated parameter matrix of the Buck converter at time k comprises:

determining an estimated value of the inductor in the Buck converter at time k according to the following formula:

$$\hat{L}(k) = \frac{E \cdot T}{\hat{x}_{15}(k)};$$

determining an estimated value of the resistor in the Buck converter at time k according to the following formula:

$$\hat{R}(k) = \frac{\hat{x}_{12}(k) \cdot E}{E - \hat{x}_{14}(k) \cdot E - \hat{x}_{16}(k)};$$

and determining estimated values of the equivalent resistor and the capacitor for equivalence of the electrolytic capacitor in the Buck converter at time k according to the following formulas:

$$\hat{R}_C(k) = \frac{\hat{x}_{16}(k) \cdot \hat{R}(k) \cdot \hat{L}(k)}{\hat{R}(k) \cdot E \cdot T - \hat{x}_{16}(k) \cdot \hat{L}(k)};$$

$$\hat{C}(k) = \frac{\hat{L}(k) \cdot \hat{x}_{16}(k)}{E \cdot \hat{x}_{12}(k) \cdot \hat{R}_C(k)}.$$

4. The fault detection method according to claim 3, wherein the determining whether the Buck converter is faulty or not according to the estimated value of each component in the Buck converter further comprises:

drawing a parameter variation curve of each component in the Buck converter according to the estimated value of the corresponding component at each time; and determining a fault value when the corresponding component is faulty according to the parameter variation curve.

* * * * *